US009704964B1

(12) United States Patent
Ordonez et al.

(10) Patent No.: US 9,704,964 B1
(45) Date of Patent: Jul. 11, 2017

(54) GRAPHENE-BASED DEVICE WITH LIQUID METAL CONTACTS

(71) Applicant: THE UNITED STATES OF AMERICA AS REPRESENTED BY THE SECRETARY OF THE NAVY, Washington, DC (US)

(72) Inventors: Richard C. Ordonez, Mililani, HI (US); Nackieb M. Kamin, Kapolei, HI (US); David Garmire, Honolulu, HI (US); Cody K. Hayashi, Waipahu, HI (US)

(73) Assignee: THE UNITED STATES OF AMERICA AS REPRESENTED BY THE SECRETARY OF THE NAVY, Washington, DC (US)

( * ) Notice: Subject to any disclaimer, the term of this patent is extended or adjusted under 35 U.S.C. 154(b) by 0 days.

(21) Appl. No.: 15/166,093

(22) Filed: May 26, 2016

(51) Int. Cl.
*H01L 29/45* (2006.01)
*H01L 29/16* (2006.01)
*H01L 29/786* (2006.01)
*C22C 28/00* (2006.01)

(52) U.S. Cl.
CPC .......... *H01L 29/45* (2013.01); *H01L 29/1606* (2013.01); *H01L 29/78603* (2013.01); *C22C 28/00* (2013.01)

(58) Field of Classification Search
None
See application file for complete search history.

(56) References Cited

PUBLICATIONS

Researchers Develop More Efficient, Reliable Means of Electrically Contacting Graphene, Sep. 20, 2016, Nanotechnology/Nanomaterials.*
J. Che, T. Cagin, and W. A. Goddard III, "Thermal conductivity of carbon nanotubes," Nanotechnology, vol. 11, No. 2, p. 65, 2000.
A. K. Geim and K. S. Novoselov, "The rise of graphene," Nature materials, vol. 6, No. 3, pp. 183-191, 2007.
J. Ryu, Y. Kim, D. Won, N. Kim, J. S. Park, E.-K. Lee, D. Cho, S.-P. Cho, S. J. Kim, G. H. Ryu et al., "Fast synthesis high performance graphene films by hydrogen-free rapid thermal chemical vapor deposition," ACS nano, vol. 8, No. 1, pp. 950-956, 2014.

(Continued)

*Primary Examiner* — Tom Thomas
*Assistant Examiner* — Steven B Gauthier
(74) *Attorney, Agent, or Firm* — SPAWAR Systems Center Pacific; Kyle Eppele; Ryan J. Friedl

(57) ABSTRACT

A device includes a substrate, a layer of graphene disposed over at least a portion of the substrate, at least one conductive trace proximate to the layer of graphene, one or more liquid metal contacts electrically connecting the layer of graphene and the at least one conductive trace, and an encasing material disposed over and enclosing the liquid metal contacts. The liquid metal contacts are in contact with a portion of the layer of graphene and an adjoining portion of the respective conductive trace. The liquid metal contacts may comprise a eutectic alloy in stable liquid form at between about −19° C. and about 1300° C., such as a gallium-based alloy. The conductive traces allow for external device connections and may be partially enclosed within the encasing material.

20 Claims, 7 Drawing Sheets

(56) References Cited

PUBLICATIONS

X. Wang, H. Tian, M. A. Mohammad, C. Li, C. Wu, Y. Yang, and T.-L. Ren, "A spectrally tunable all-graphene-based flexible field-effect light-emitting device," Nature communications, vol. 6, 2015.
H. Y. Jeong, J. Y. Kim, J. W. Kim, J. O. Hwang, J.-E. Kim, J. Y. Lee, T. H. Yoon, B. J. Cho, S. O. Kim, R. S. Ruoff et al., "Graphene oxide thin films for flexible nonvolatile memory applications," Nano letters, vol. 10, No. 11, pp. 4381-4386, 2010.
G. A. Salvatore, N. Münzenrieder, T. Kinkeldei, L. Petti, C. Zysset, I. Strebel, L. Büthe, and G. Troster, "Wafer-scale design of light-weight and transparent electronics that wraps around hairs," Nature communications, vol. 5, 2014.
A. Pospischil, M. Humer, M. M. Furchi, D. Bachmann, R. Guider, T. Fromherz, and T. Mueller, "Cmos-compatible graphene photodetector covering all optical communication bands," Nature Photonics, vol. 7, No. 11, pp. 892-896, 2013.
J. Fan, J. Michalik, L. Casado, S. Roddaro, M. Ibarra, and J. De Teresa, "Investigation of the influence on graphene by using electron-beam and photo-lithography," Solid State Communications, vol. 151, No. 21, pp. 1574-1578, 2011.
R. D. P. Wong, J. D. Posner, and V. J. Santos, "Flexible microfluidic normal force sensor skin for tactile feedback," Sensors and Actuators A: Physical, vol. 179, pp. 62-69, 2012.
G. Maltezos, R. Nortrup, S. Jeon, J. Zaumseil, and J. A. Rogers, "Tunable organic transistors that use microfluidic source and drain electrodes," Applied physics letters, vol. 83, No. 10, pp. 2067-2069, 2003.
T. L. Liu, P. Sen, and C.-J. C. Kim, "Characterization of liquid metal galinstan R for droplet applications," in Micro Electra Mechanical Systems (MEMS), 2010 IEEE 23rd International Conference on. IEEE, 2010, pp. 560-563.
B. Xiaoping, L. Guowei, W. Wei, Z. Mingjiang, L. Wanhuan, Z. Libing, and Z. Yaping, "Contact surface condition effect on contact resistance and improving methods," in Electrical Contacts (ICEC 2012), 26th International Conference on. IET, 2012, pp. 368-374.
M. Read, J. Lang, A. Slocum, and R. Martens, "Contact resistance in flat thin films." Institute of Electrical and Electronics Engineers, 2009.
K. i Kemi, "Reactivity of galinstan with specific transition metal carbides," 2014.
P. Ahlberg, S. H. Jeong, M. Jiao, Z. Wu, U. Jansson, S.-L. Zhang, and Z.-B. Zhang, "Graphene as a diffusion barrier in galinstan-solid metal contacts," Electron Devices, IEEE Transactions on, vol. 61, No. 8, pp. 2996-3000, 2014.
Liu, T; Sen, P.; Kim, C. "Characterization of Nontoxic Liquid-Metal Alloy Galinstan for Applications in Microdevices,"Microelectromechanical Systems, Journal of , (2012). 21(2): 443-450.
R. C. Gough, A. M. Morishita, J. H. Dang, W. Hu, W. Shiroma, A. T. Ohta et al., "Continuous electrowetting of non-toxic liquid metal for rf applications," Access, IEEE, vol. 2, pp. 874-882, 2014.
M. A. Eddings, M. A. Johnson, and B. K. Gale, "Determining the optimal pdms—pdms bonding technique for microfluidic devices," Journal of Micromechanics and Microengineering, vol. 18, No. 6, p. 067001, 2008.
Norton, P. "HgCdTe infrared detectors," Optoelectronics review 3 (2002): 159-174.
Nair, R.R.; et. al. "Fine Structure Constant Defines Visual Transparency of Graphene". (2008). 320(1308).
Zhang, Yongzhe, et al. "Broadband high photoresponse from pure monolayer graphene photodetector." Nature communications (2013) 4(1811): 1-11.

\* cited by examiner

GRAPHENE-BASED DEVICE WITH LIQUID METAL CONTACTS

FEDERALLY SPONSORED RESEARCH AND DEVELOPMENT

The Graphene-Based Device with Liquid Metal Contacts is assigned to the United States Government. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil. Reference Navy Case No. 103522.

BACKGROUND OF THE INVENTION

As industry continuously miniaturizes circuits by compressing passive and active electrical components into smaller areas, thermal management difficulties are exacerbated and additional stress is placed on device interconnects. For circuitry comprised of monolayer graphene, multilayer graphene, graphene microstructures, or graphene nanostructures, especially flexible circuitry, there is a current need for more robust device interconnects that can withstand a variety of shapes and contours while reducing or eliminating junction resistance.

DETAILED DESCRIPTION OF SOME EMBODIMENTS

Figure 1:
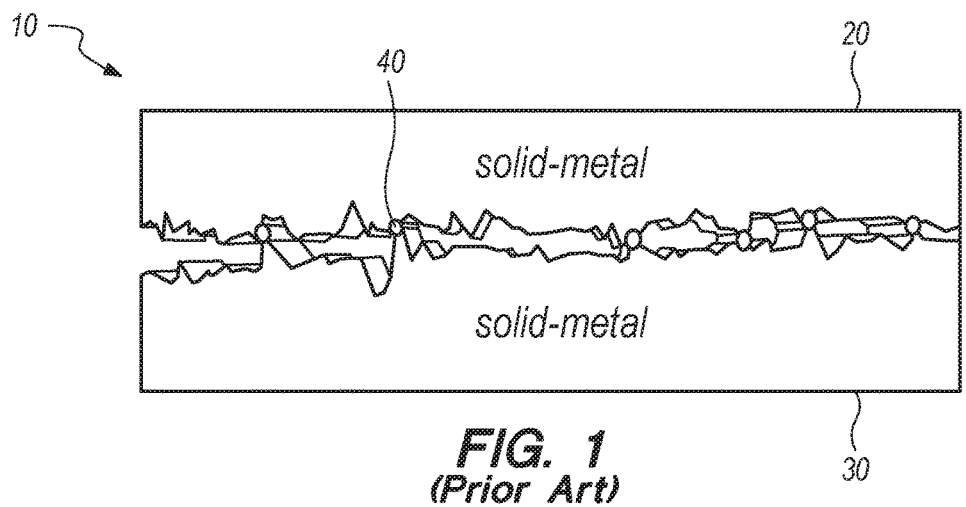
FIG. 1 shows a diagram of a prior art method for making electrical contact using a solid metal layer disposed on another solid metal layer.

Reference in the specification to "one embodiment" or to "an embodiment" means that a particular element, feature, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of the "a" or "an" are employed to describe elements and components of the embodiments herein. This is done merely for convenience and to give a general sense of the invention. This detailed description should be read to include one or at least one and the singular also includes the plural unless it is obviously meant otherwise.

The discovery of monolayer and multilayer graphene has led to possible implementations of atomically thin, conductive, transparent, and flexible devices. Further, as carbon nanomaterials become more available due to a reduction in the synthesis cost, the high thermal conductivity and atomic thickness of graphene provides unique opportunities for a variety of applications where size, shape, and conformability to unconventional contours are critical.

Recent attempts to utilize graphene in thin and flexible electronics have led to advances in capacitive multi-touch sensors, graphene-based light-emitting devices, and non-volatile memory. Reliability and high performance are rarely achieved due to problems related to interfacial delamination and cracking of traditional device interconnects that are mainly comprised of standard electrode materials, such as gold, silver, titanium, chromium, and their composites.

One potential solution to construct thin and flexible devices comprised of monolayer and multilayer graphene is to fabricate interconnects with titanium and gold that utilize physical vapor deposition (PVD) processes such as plasma-enhanced thermal evaporation and or metal sputtering. However, PVD processes are expensive, tedious, and rely on lithographic techniques that have consistently proven to alter the electronic properties of graphene. For example, the photoresist and deposition gases used in PVD processes lead to unwanted chemical doping and contamination that reduce device yield and alter performance. However, this method results in irreversible mechanical degradation of graphene, such as wrinkling, cracking, delamination, that lead to undesirable electrical properties such as changes in resistivity and device failure.

A coated surface is hardly flat despite matured PVD processes. At the microscale, contaminants and surface artifacts from metal deposition protrude outward. FIG. 1 shows a diagram 10 of a prior art method for making electrical contact using a first solid metal layer 20 disposed on a second solid metal layer 30, with contact being made at contact points 40. As shown in FIG. 1, when two coated surfaces form a solid-metal/solid-metal junction, the surface roughness limits the surface-to-surface contact area to only the contact points 40. As a result, current becomes constricted to the minimal contact areas, which causes in an increase in contact resistance.

A fundamental understanding of metal junctions demonstrates that the contact resistance $R_c$ can be reduced by increasing the junction contact area $A_c$, where the effective resistivity of a contact material is $\rho$.

$$R_c = \frac{\rho}{A_c} \quad \text{(Eq. 1)}$$

Figure 2:
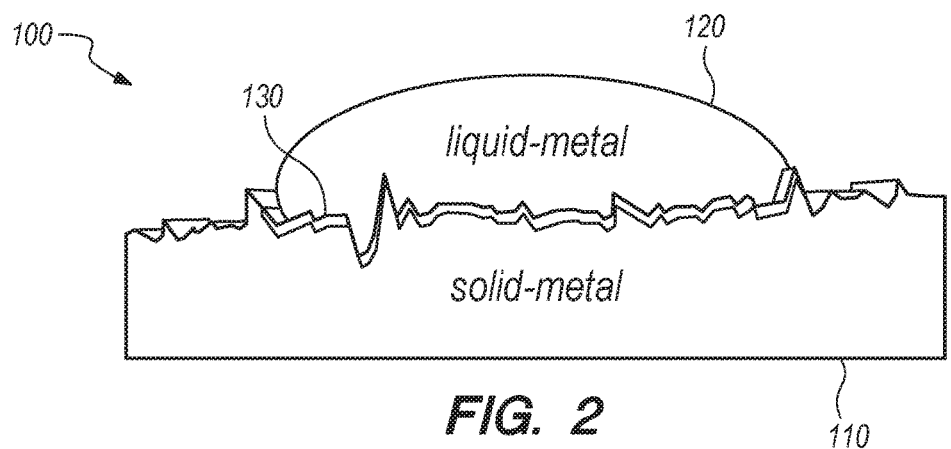
FIG. 2 shows a diagram illustrating a method for making electrical contact using liquid metal disposed on a solid metal layer in accordance with the Graphene-Based Device with Liquid Metal Contacts.

FIG. 2 shows a diagram 100 illustrating a method for making electrical contact using a solid metal layer 110 having liquid metal 120 disposed thereon, with such method being used in the embodiments of the devices disclosed herein. As shown in FIG. 2, liquid-metal provides desirable surface adhesion properties that accommodate surface topography and enable large-area surface coverage as shown by contact line 130. This results in desirable current flow across the junction.

The effects of contact degradation become negligible in liquid-metal/solid-metal junctions as the deformation of a solid surface no longer compromises the contacting material when flexed. In addition, the low bulk resistivity of liquid-metals allow for a large current carrying capacity that is required by many applications in which power loss is a critical performance factor. While conductive fluids, such as liquid-metal mercury, have been used to make connections in micro-electromechanical systems and micro-fluidics for various applications, the toxicity of liquid-metal mercury has slowed large-scale device integration.

Disclosed herein are embodiments of a graphene device with conformal non-toxic liquid-metal interconnects. The disclosed embodiments may be particularly useful for certain applications such as thin and flexibly circuitry, electromagnetic sensors, and passive or active electrical components. The disclosed embodiments may also be useful for fabricating devices including wearable electronics, flexible power sources, solar cells, optical sensors, radio-frequency devices, and chemical-biological detectors with increased performance due to the utilization of monolayer and multilayer graphene or other graphene microstructures or graphene nanostructures.

Some of the disclosed embodiments may have the potential to improve intrinsic electromagnetic sensitivity and high-speed individual photon-counting by integrating the electromagnetic sensitivity of two-dimensional graphene nanostructures with complementary metal-oxide-semiconductor (CMOS) technology.

Recent advances in graphene infrared sensor technology have achieved photocurrents ~8.61 A/W over a broad bandwidth range from visible to long-infrared. However, these devices are slow due to long carrier lifetimes that exist due to trapped charge carriers within an induced graphene bandgap at each metal-semiconductor interconnect. The disclosed embodiments utilizing liquid metal (e.g. Galinstan) and semi-metal (e.g. graphene) ohmic contacts offer truly low resistance ohmic contacts that do not impede the flow of fast moving charge carriers. In addition, the disclosed embodiments may utilize various liquid metal (e.g. Galinstan) compositions with semi-metal (e.g. graphene) to form Schottky contacts that offer additional benefits for devices requiring rectification.

Liquid metal is a gallium alloy with high electrical conductivity of about $3.4 \times 10^6$ S/m, a thermal conductivity of about $16.5 \text{ W*m}^{-1}\text{*K}^{-1}$, and the ability to exist in a liquid state at room temperature (−19° C. to 1300° C., with a boiling point >1300° C.). The disclosed embodiments utilize the nobility of carbon monolayers, multilayers, micro-structures or nano-structures to reduce the likelihood of oxidation at the graphene liquid metal interconnect; therefore, a clean ohmic contact with minimal to no contact resistance is constructed. With such a technique, the inert electrical properties of graphene are utilized, resulting in a device that is both fast and reliable.

In some embodiments, the liquid-metal used is a eutectic alloy. In some embodiments, the eutectic alloy is a gallium-based alloy. In some embodiments, the gallium-based alloy comprises a combination of two or more of gallium, indium, and tin. As an example, the gallium-based alloy is Galinstan. Galinstan is a commercially available eutectic alloy of low toxicity, typically comprising 68.5% gallium, 21.5% indium, and 10.0% tin. The properties of Galinstan include the conductivity of a metal (about $3.4 \times 10^6$ S/m), a desirable vapor pressure (<$1 \times 10^{-6}$ Pa at 500° C.) compared to mercury, and a stable liquid state across a broad temperature range (between about −19° C. to about 1300° C.).

Large-scale device integration of liquid-metals such as Galinstan exhibits an alloying effect in contact with common metals: copper, tin, lead, zinc, gold, silver, and aluminum. Insulating oxide barriers form at the liquid-metal/solid-metal interfaces, which lead to electronic instability, and ultimately hinder device performance. Carbon-based materials provide a unique solution for liquid-metal integration as the inertness of carbon does not allow amalgamation to occur. The conformability of liquid-metals combined with the conductivity and inertness of carbon materials enables electrical stability for a variety of contours.

Figure 3A:
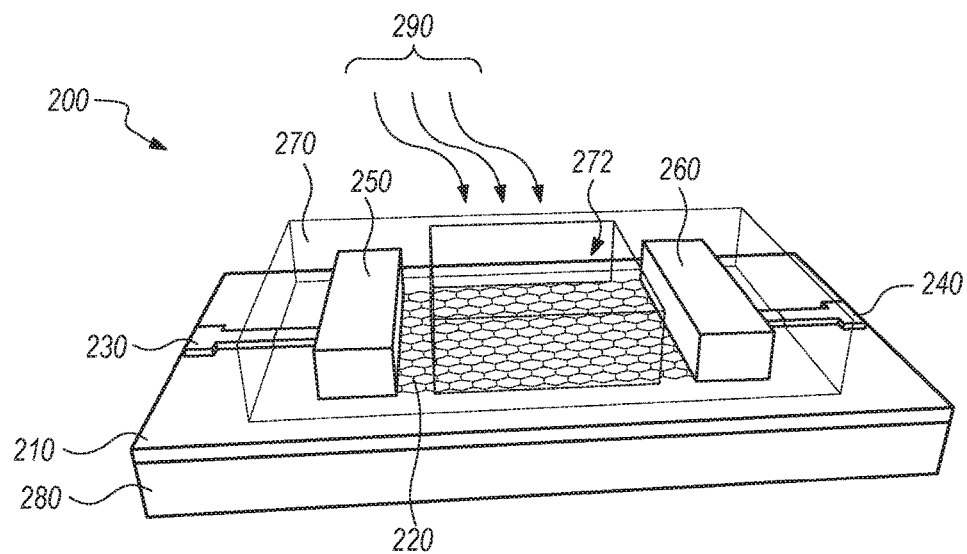
FIG. 3A shows a perspective side-view of an embodiment of a device in accordance with the Graphene-Based Device with Liquid Metal Contacts.
Figure 3B:
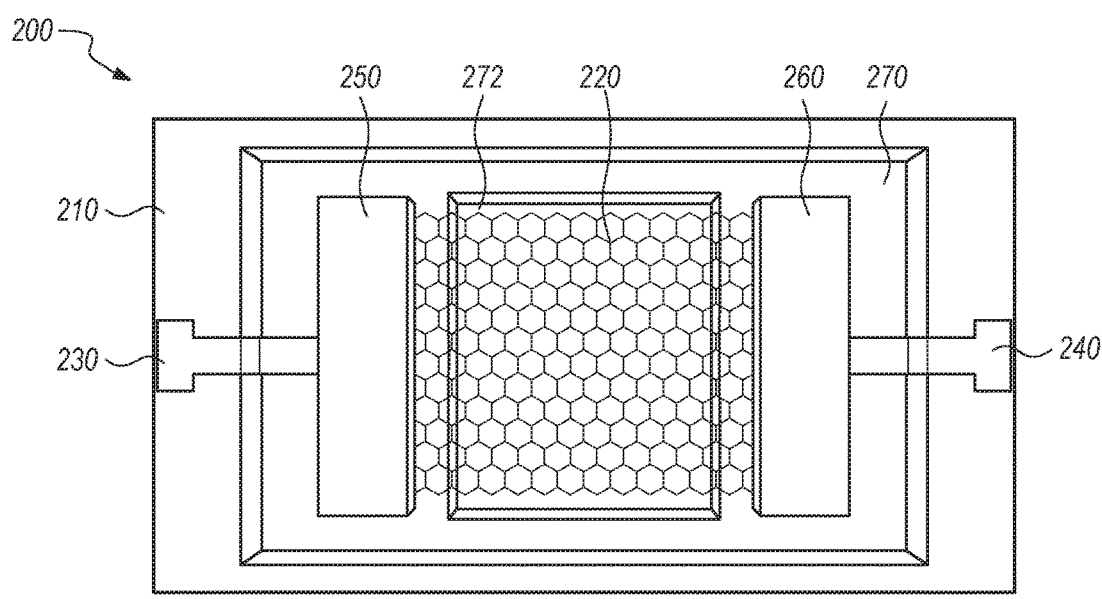
FIG. 3B shows a top view of the device shown in FIG. 3A.

Referring to FIGS. 3A and 3B, FIG. 3A shows a perspective side view of an embodiment of a device 200 in accordance with the Graphene-Based Device with Liquid Metal Contacts and FIG. 3B shows a top view of device 200. As shown, device 200 is a graphene field-effect transistor with transistor characteristics altered with an electrically-controlled gate; however other devices having different configurations may utilize the subject matter disclosed herein. Such embodiments may include graphene field effect transistors with no physical gate (i.e. 2-terminal device biased by external electromagnetic source 290), a single top-gate, a single side-gate, a dual-gate, or any transistor configuration in which liquid metal contact is required for graphene.

Device 200 includes dielectric layer 210, a layer of graphene (e.g. monolayer graphene, multilayer graphene, micro-structure, nano-structure, or other carbon structure) 220 disposed over at least a portion of substrate 210, at least one conductive trace 230 and 240 proximate to layer of graphene 220 that can connect device 200 to other circuitry, one or more liquid metal contacts 250 and 260 each electrically connecting layer of graphene 220 and a separate one of conductive trace 230 and 240, and an encasing material 270 disposed over and enclosing liquid metal contacts 250 and 260. In some embodiments, encasing material 270 has an opening 272 therein to allow direct exposure to layer of graphene 220 by, for example, electromagnetic source 290. Device 200 further includes a substrate layer 280 for electronic gating disposed on the underside of substrate 210. Conductive layer 280 helps provide electrical bias to device 200 to manipulate transistor operation.

In some embodiments, dielectric layer 210 comprises a flexible material. In some embodiments, dielectric layer 210 comprises a dielectric material, such as elastic polymers: polyethylene terephthalate (PET), polydimethylsiloxane (PDMS), polyimide, and thermoplastic elastomers (TPE), and Poly-methyl methacrylate (PMMA). In some embodiments, dielectric layer 210 comprises an oxide layer, including but not limited to Hafnium oxide, Silicon oxide, and Aluminum oxide.

In some embodiments, layer of graphene 220 is a monolayer of graphene, having only a one atom thickness. In some embodiments, layer of graphene 220 comprises a multi-layer of graphene having a thickness of more than one atom. In some embodiments, layer of graphene 220 comprises a layer of graphene microstructures or graphene nanostructures including graphene stacks and nano-disks.

Liquid metal contacts 250 and 260 are in contact with a portion of the layer of graphene 220 and an adjoining portion of a respective one of conductive trace 230 and conductive trace 240. Liquid metal contacts 250 and 260 comprise a eutectic alloy in stable liquid form at room temperature. As discussed above, liquid metal contacts 250 and 260 may comprise a gallium-based alloy. In some embodiments, the gallium-based alloy includes a combination of two or more of gallium, indium, and tin, such as the commercially-available Galinstan. While liquid metal contacts 250 and 260 are shown as being polygonal in shape, it should be recognized that liquid metal contacts 250 and 260 may comprise any variety of shapes, as will be necessitated by various factors including space limitations and method for creating/dispensing liquid metal contacts 250 and 260.

In some embodiments, encasing material 270 comprises a synthetic organic-based material. As an example, encasing material 270 may comprise a silicon-based material. In some embodiments, encasing material 270 comprises a polymer, an example of which is polyimide. Other non-limiting examples of encasing materials 270 include PET, PDMS, TPE, and PMMA. In some embodiments, the encasing material may be a rigid metal, silicon-based material, or oil-based material. However, it should be understood that other types of materials currently known and not-yet-discovered, may be suitable for use as an encasing material 270 consistent with its use and disclosure herein, as would be recognized by a person having ordinary skill in the art.

As shown in FIG. 3B, conductive traces 230 and 240 may comprise any type of conductive path configured to allow current or voltage to pass through a liquid-metal contact. In some embodiments, conductive traces 230 and 240 lead to devices (not shown) integrated on an external circuit (not shown). As a non-limiting example, conductive traces 230 and 240 may comprise any conductive electrode, such as a wire electrode, comprising materials including but not limited to gold, graphene, and liquid metal. In some embodiments, conductive traces 230 and 240 are disposed on top of substrate 210 proximate to or adjacent to layer of graphene 220 as shown in FIG. 3B. In some embodiments, conductive traces 230 and 240 have impedance matching to any of the devices integrated on an external circuit. Further, in some embodiments, conductive traces 230 and 240 may be at least partially disposed within the encasing material 270, as shown.

Figure 4A:
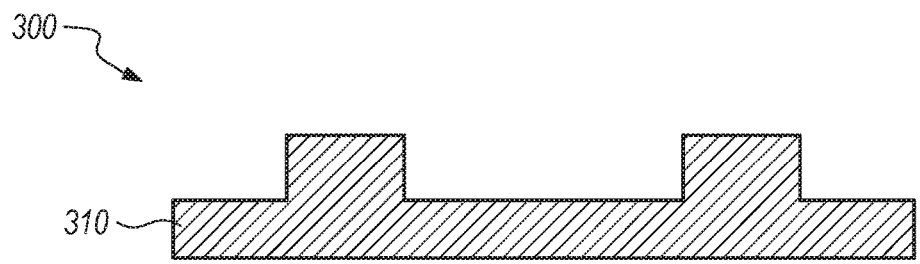
FIGS. 4A-4G illustrate a method for manufacturing an embodiment of a device in accordance with the Graphene-Based Device with Liquid Metal Contacts.
Figure 4B:
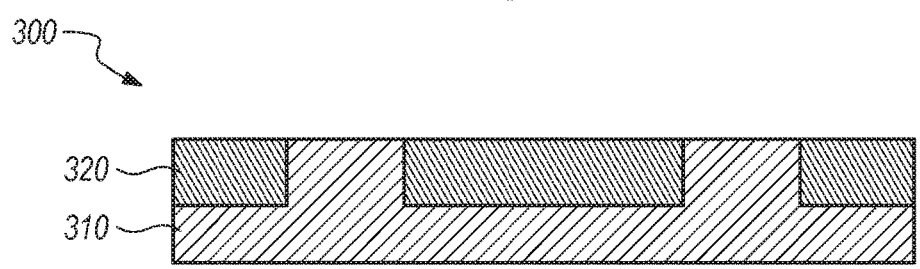
Figure 4C:
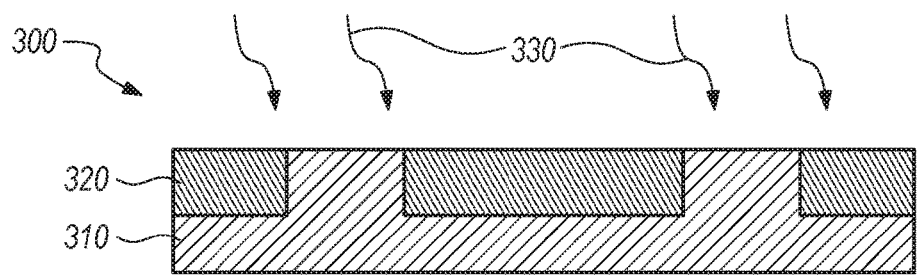
Figure 4D:
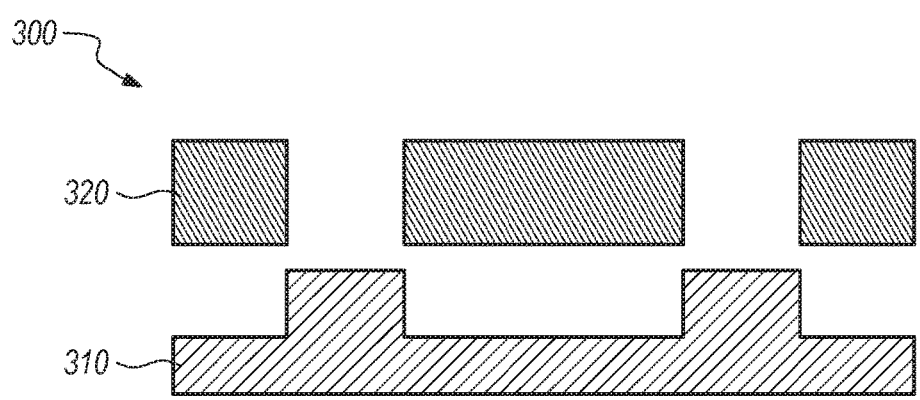

Referring now to FIGS. 4A-4G, a method is shown for manufacturing an embodiment of a device 300 in accordance with the Graphene-Based Device with Liquid Metal Contacts. FIG. 4A shows the first stage of the process, with device 300 beginning with a master mold 310 to create a polymer structure. As shown in FIG. 4B, a polymer casting 320 is formed over master mold 310. As shown by arrows 330 in FIG. 4C, polymer casting 320 is annealed. As shown in FIG. 4D, polymer casting 320 is released from master mold 310.

Figure 4E:
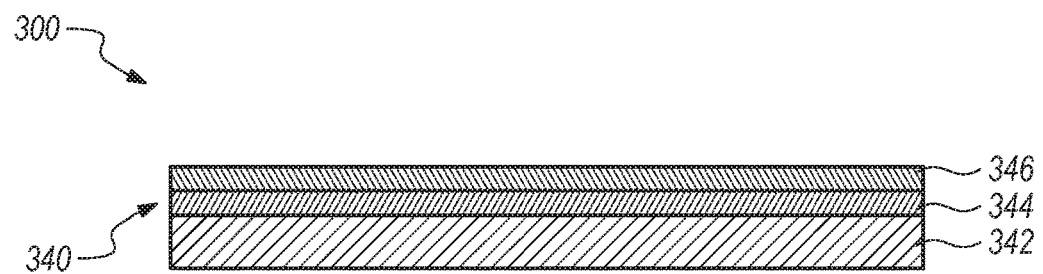
Figure 4F:
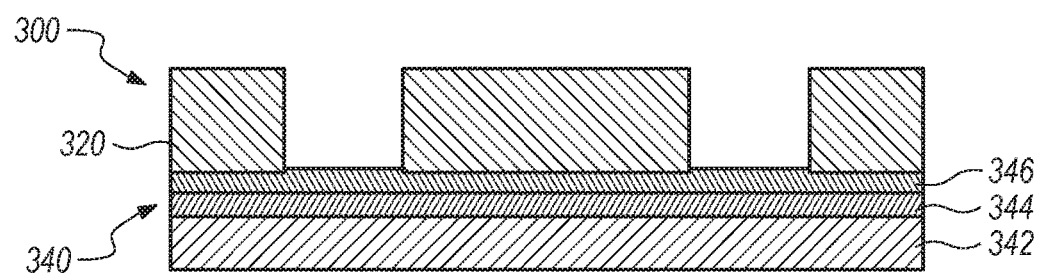
Figure 4G:
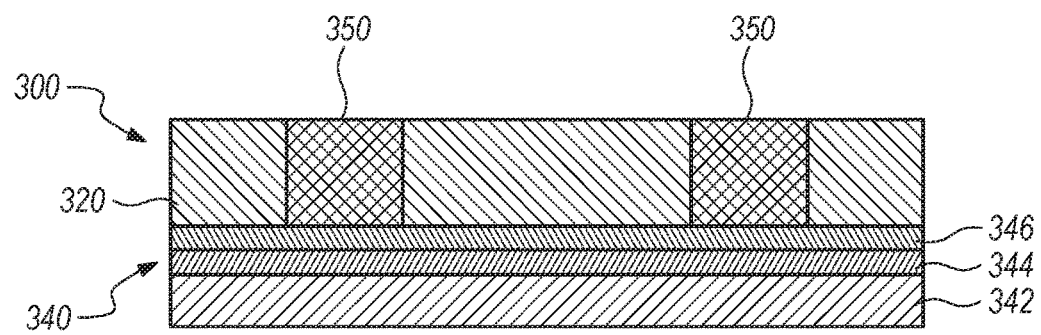

In FIG. 4E, a new graphene/support substrate 340 is provided. Substrate 340 comprises a bottom substrate layer 342, a middle dielectric layer 344, and a graphene top layer 346. In some embodiments, graphene top layer 346 can be patterned to allow liquid-metal 350 to contact dielectric layer 344 while remaining in contact to graphene top layer 340. As shown in FIG. 4F, the previously created polymer structure 320 is positioned on the new graphene/support substrate 340. As shown in FIG. 4G, liquid-metal 350 is injected into the spaces within polymer structure 320.

Figure 5A:
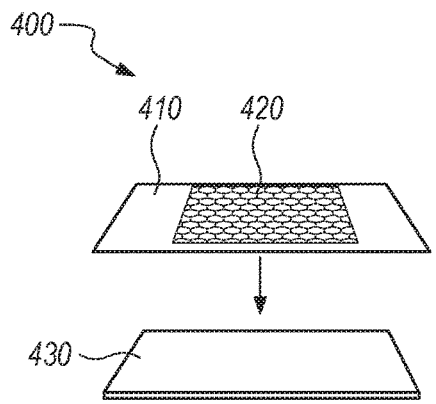
FIGS. 5A-5D illustrate a method for manufacturing another embodiment of a device in accordance with the Graphene-Based Device with Liquid Metal Contacts.
Figure 5B:
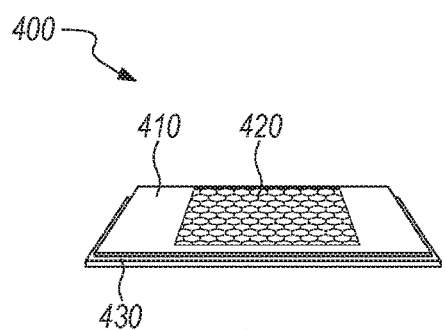

Referring now to FIGS. 5A-5D, a method is shown for manufacturing another embodiment of a device 400 in accordance with the Graphene Device with Liquid Metal Contacts. FIG. 5A shows a substrate 410, such as Polyethylene Terephthalate (PET), having a layer of graphene 420 disposed thereon, being disposed on top of a layer of polyimide film 430 to create device 400 as shown in FIG. 5B. In some embodiments substrate 410 may be a flexible substrate. As an example, layer of graphene 420 may be grown by chemical vapor deposition on copper foil then subsequently transferred onto substrate 410. Graphene on PET allows for a manageable substrate thickness that makes it easy to cut the samples to a desired width and length with standard cutting tools.

Figure 5C:
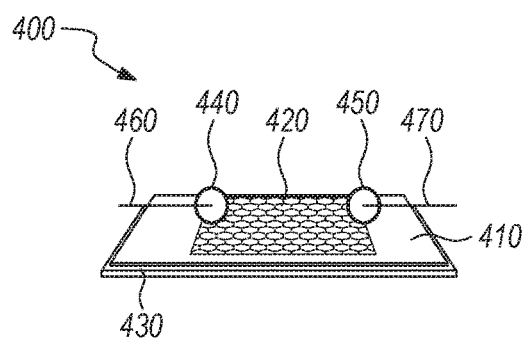

As shown in FIG. 5C, liquid-metal droplets 440 and 450 are dispensed on top of the edge of substrate 410 and an adjoining portion of layer of graphene 420. In some embodiments, the liquid-metal comprises Galinstan. Before being dispensed, the Galinstan may be stored in a solution of 1% NaOH (Sodium Hydroxide) and de-ionized water to preclude the fast oxidation of Galinstan in oxygen, but not limited to NaOH. The NaOH solution helps prevents gallium oxide formation on the surface of Galinstan, which if present would rapidly lower the surface tension of Galinstan and cause problems during transport.

As an example, a Galinstan droplet of a desirable volume may be dispersed with a syringe needle onto the graphene boundaries to form the electrodes of the device as shown in FIG. 5C. To enable quick connectivity with external devices, electrodes 460 and 470 may then be embedded within the liquid-metal to provide contact with other components (not shown) on or within device 400. As an example, electrodes 460 and 470 may be a wire made of gold, copper, silver, or any conductive material. In some embodiments, electrodes 460 and 470 may be similar to conductive trace 230 and 240 shown in FIG. 3. In that the conductive path is used to connect device 400 to an external circuit (not shown).

Gallium alloys experience a rapid surface oxidation, introducing challenges in that the formation of surface oxides degrade surface tension and cause liquid-metal droplets to actively adhere to surrounding surfaces. The result is an inability to move liquid-metal structures through microfluidic systems with ease. Multiple techniques are available to prevent oxide growth, such as strong acid/base immersion, atmospheric controlled environments, or encasement in oxygen impermeable materials. In any approach, proper control over oxide growth enables the liquid-metal to move freely in a liquid state.

Figure 5D:
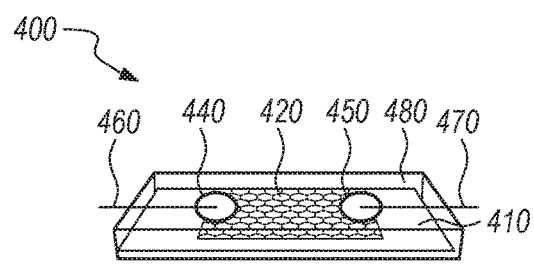

Accordingly, as shown in FIG. 5D, a encasing structure 470 is disposed over substrate 410, layer of graphene 420, liquid-metal droplets 440 and 450, and portions of electrodes 460 and 470, such that liquid-metal droplets 440 and 450 are encapsulated to help prevent the formation of oxides, such as gallium oxide. As an example, enclosure 470 may be a polyimide film, but other materials may be used such as those shown and described with respect to graph 500 in FIG. 6. While the above-described technique is described with reference to use of syringes for dispensing the liquid-metal, it may also be readily applied to a microfluidic platform into which liquid-metal can be injected with an advanced pipetting system.

Figure 6:
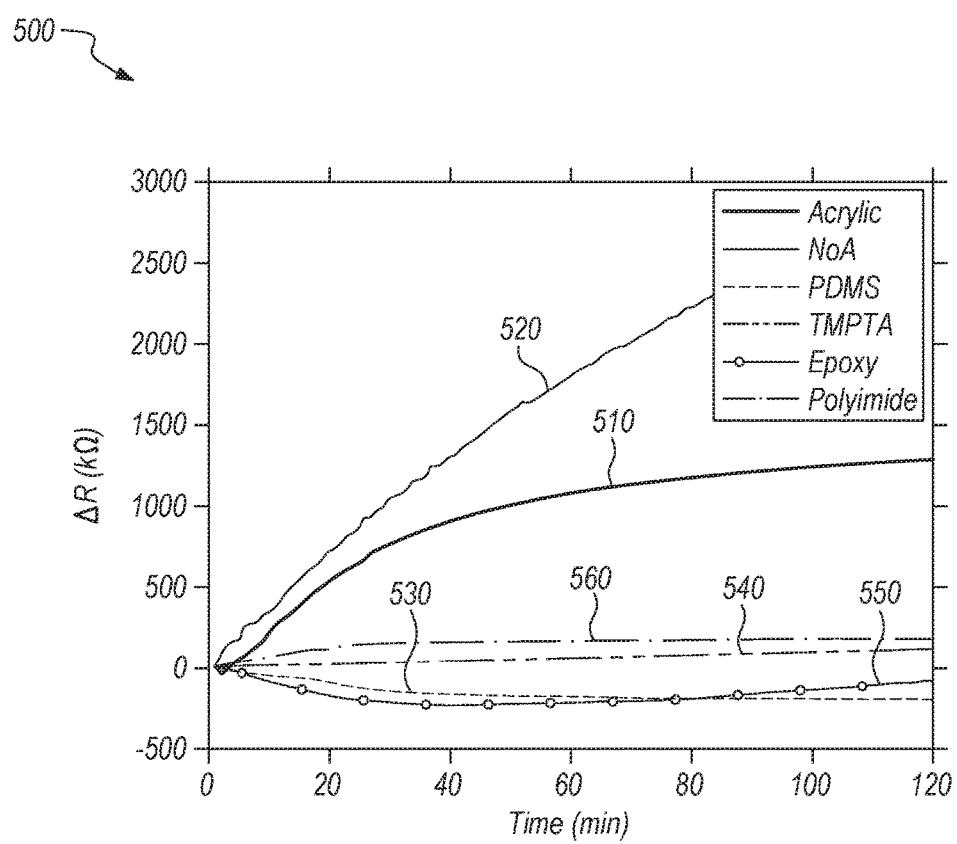
FIG. 6 shows a graph illustrating the change in resistance as a result of liquid-metal oxidization for a two-hour period using various liquid-metal encapsulating materials.

FIG. 6 shows a graph 500 illustrating test results for the change in resistance as a result of liquid-metal oxidization for a two-hour period using various liquid-metal encapsulating materials. The ΔR shown in graph 500 represents the change in resistance with respect to the total resistance of a test device. As shown, line 510 represents an acrylic material (Krylon Crystal Clear Acrylic Coating), line 520 represents Norland Optical Adhesive 75 (NOA75), line 530 represents Polydimethysiloxane (PDMS, Sylgard Elastomer 184), line 540 represents Trimethylolpropane Triacylate (TMPTA), line 550 represents Bisphenol A Diglycidyl Ether Epoxy Resin, and line 560 represents polyimide tape.

As can be seen in graph 500, NOA75 resulted in the quickest change in resistance due to its moderate gas permeability. The quick change in resistance of the acrylic coating was attributed to the structural breaks in the acrylic film, since the film was applied in an aerosol form. PDMS and the epoxy resin exhibited a negative change in resistance and are believed to be a result of NaOH evaporation. In the event the NaOH evaporated slowly, the surface tension of the encapsulated Galinstan degraded slightly; hence the result was an initial increase in contact area (decreased resistance) followed by additional oxide formation (increased resistance). The TMPTA showed a minimal resistance change (less than 100 ohms) and is due to its much lower gas permeability with respect to the other materials.

The rigidness of the solidified TMPTA did not allow for flexible operation, as such polyimide was determined to be the best suited for applications requiring some flexibility as the change in resistance was less than a few hundred ohms over the two hour period, which greatly outperformed the other materials that also promote flexible operation. Given the above results, a combination of polyimide, electrolyte immersion, and an atmospheric controlled environment has the potential for complete elimination of oxide growth.

Figure 7:
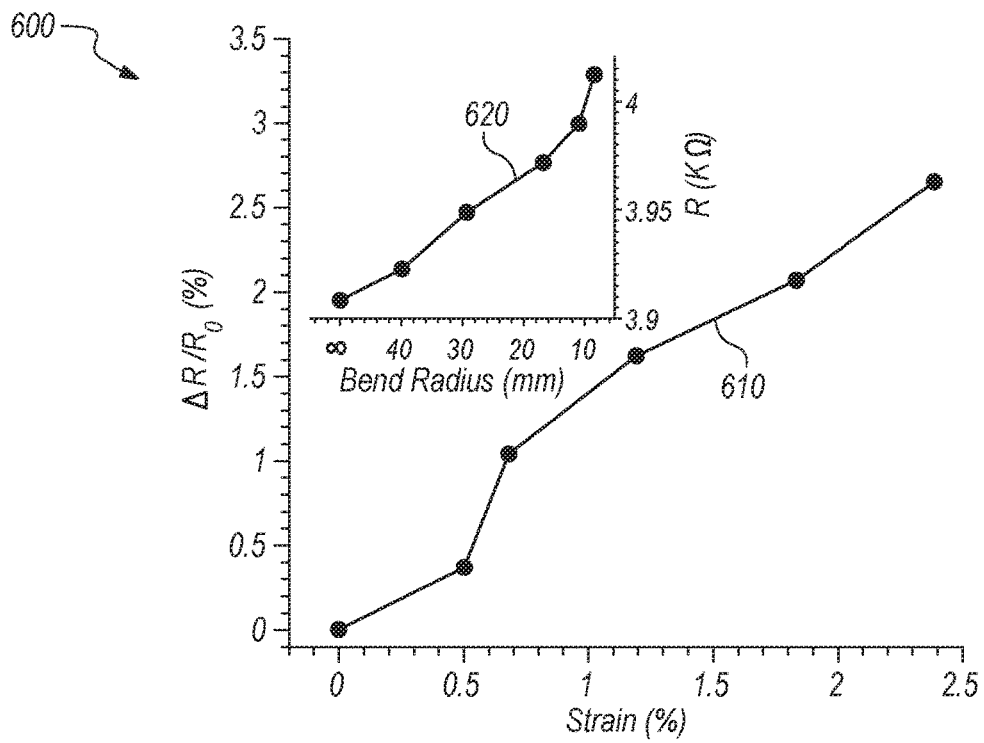
FIG. 7 shows a graph illustrating a normalized change in resistance as a function of applied strain and bend radius for an incremental bend test performed on an embodiment of Graphene-Based Device with Liquid Metal Contacts.
Figure 8:
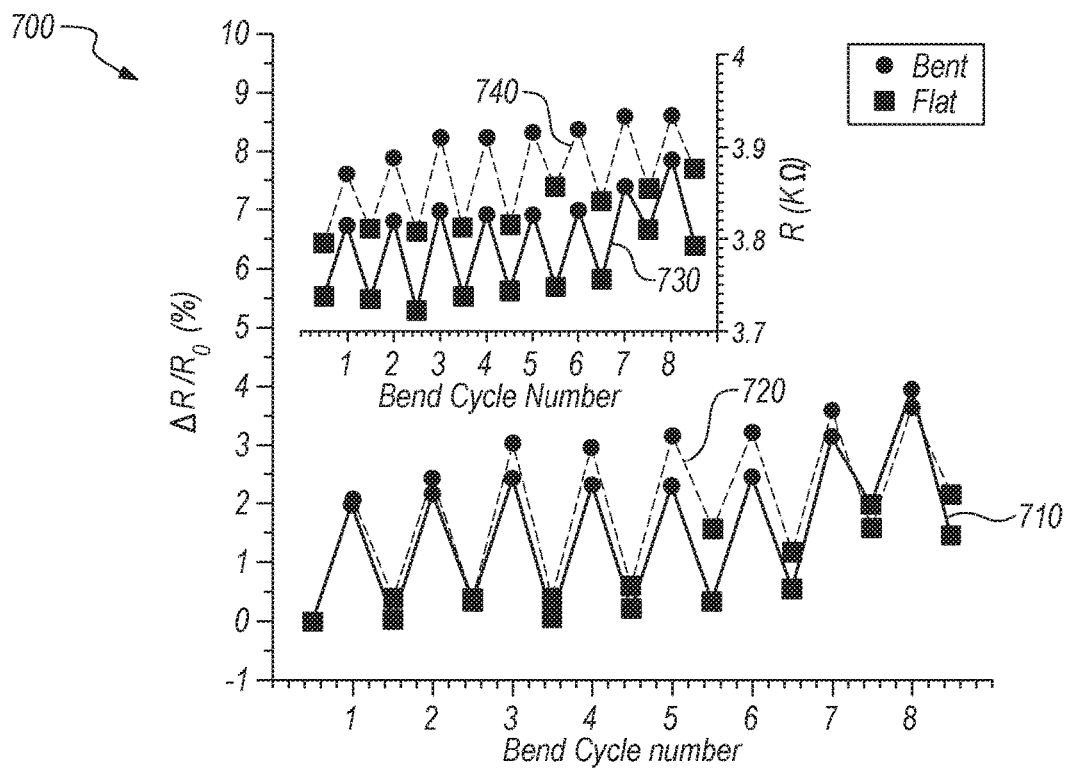
FIG. 8 shows a graph illustrating a change in resistance as a function of bend cycle number for two separate bend tests performed on an embodiment of Graphene-Based Device with Liquid Metal Contacts.

FIGS. 7 and 8 show graphs illustrating results from bend tests conducted on an embodiment of a device as disclosed herein. For the bend tests, the device was mounted in a bend test apparatus. The bend radius was then incremented from flat (no strain) to 2.5 mm. For the first bend cycle of each test, the change in resistance from strain was less than 3%. This result was repeatable, and similar results were achieved with the incremental bend test for multiple devices. Subsequent bend cycles exhibited a change in resistance up to 4%. The devices intrinsic increase in resistance over time is illustrated by the general, rising trend of the flat position data points. This can be attributed to the effects of Galinstan oxidation. The effects of oxidation can be reduced by a combination of techniques discussed above. Such procedures should allow for repeatable operation with negligible degradation over time.

FIG. 7 shows a graph 600 illustrating a normalized change in resistance as a function of applied strain and bend radius for an incremental bend test performed on the device. Line 610 represents the normalized change in resistance as a function of applied strain, while line 620, shown in the inset, represents the two-terminal resistance (including the graphene material) as a function of bend radius. As shown in the graph, $R_0$ represents the total resistance of the two-terminal device in a flat position and ΔR represents the difference in resistance of the bent position with respect to the flat position for the two-terminal device.

FIG. 7 illustrates the change in resistance as a function of applied strain and bend radius. The resistance was relatively unchanged (less than 3%) for curvatures as small as 2.5 mm. Any slight increases in resistance were attributed to observable stresses on the polyimide cavities that caused the ceilings of the cavities to collapse and displace the bulk of the liquid-metal structure away from the graphene surface. The result was a decrease in the graphene surface area coverage and an increase in resistance. In the worst-case scenario, the polyimide film would separate from the PET substrate and release the liquid-metal outside the device. This effect can be attributed to poor adhesion between the PET substrate and the polyimide film. Bond strength can be improved via additional techniques such as plasma treatment and soft lithography.

It should be noted that an increase in resistance only occurred when liquid-metal was displaced from the graphene material. Typical PVD based interconnects can peel or tear graphene from a bottom substrate, therefore, irreversibly damaging the device. In our proposed method, the liquid-metal displacement is reversible, and a low resistance is restored after the liquid-metal returns to its original graphene contact position.

FIG. 8 shows a graph 700 illustrating a change in resistance as a function of bend cycle number for two separate bend tests performed on the device. Line 710 represents the change in resistance as a function of bend cycle number for the device in a flat position, while line 720 represents the device in a bent position. The inset illustrates the two-terminal resistance as a function of bend cycle number for the same two bend tests, where line 730 represents the device in a flat position and line 740 represents the device in a bent position.

Some embodiments of the devices discussed above can explore platforms for growth and processing of monolayer graphene, multilayer graphene, and graphene micro-structure or nano-structures over large area CMOS architecture in an effort to achieve electromagnetic sensing. Platforms can be investigated to improve read sensitivity to detect electromagnetic energy of faint targets such as military, space, and biological applications, therefore, reducing the need for complex noise reducing hardware or software algorithms and reducing the strain on additional systems. The development and hybridization of low-power MOS, CMOS, or VLSI readout integrated circuit (ROIC) may also be integrated to achieve ultrafast charge transfer rates in any portion of the electromagnetic spectrum.

Similarly, techniques used within the disclosed embodiments of the devices herein may be extended to detecting charge interaction on the exposed surface of the graphene or 2D sensing materials. It can be shown that 2D materials inherit some of the fundamental electronic properties of the materials that they contact. On the other hand, the 2D layer provides protection between the sensing platform and the potentially harsh chemicals in the environment. The combination of these two effects may allow us to complete ultrafast electronic, magnetic, and thermal interrogation of chemicals that come in contact with the surface of graphene.

Many modifications and variations of the embodiments disclosed herein are possible in light of the above description. Within the scope of the appended claims, the disclosed embodiments may be practiced otherwise than as specifically described. Further, the scope of the claims is not limited to the implementations and embodiments disclosed herein, but extends to other implementations and embodiments as may be contemplated by those having ordinary skill in the art.

We claim:

1. A device comprising:
   a substrate;
   a layer of graphene disposed over at least a portion of the substrate;
   at least one conductive trace proximate to the layer of graphene;
   one or more liquid metal contacts, wherein each liquid metal contact electrically connects the layer of graphene and a separate one of each of the at least one conductive trace, the liquid metal contacts comprising a eutectic alloy in stable liquid form over a temperature range of between about −19° C. and about 1300° C., the liquid metal contacts each being in contact with a portion of the layer of graphene and an adjoining portion of a respective one of the at least one conductive trace; and
   an encasing material disposed over and enclosing the liquid metal contacts.

2. The device of claim 1, wherein the substrate comprises a flexible material.

3. The device of claim 1, wherein the substrate comprises a dielectric material.

4. The device of claim 3, wherein the dielectric material comprises a polymer.

5. The device of claim 1, wherein the eutectic alloy is a gallium-based alloy.

6. The device of claim 5, wherein the gallium-based alloy comprises two or more of gallium, indium, and tin.

7. The device of claim 1, wherein the encasing material comprises a synthetic organic-based material.

8. The device of claim 1, wherein the layer of graphene comprises monolayer graphene.

9. The device of claim 1, wherein the layer of graphene comprises multilayer graphene.

10. The device of claim 1, wherein the layer of graphene comprises graphene microstructures.

11. The device of claim 1, wherein the layer of graphene comprises graphene nanostructures.

12. The device of claim 1, wherein the at least one conductive trace comprises a conductive path configured to allow at least one of current and voltage to pass through the liquid-metal contacts.

13. The device of claim 1, wherein the conductive trace is configured to have impedance matching to an external circuit.

14. The device of claim 1, wherein the at least one conductive trace is disposed on top of the substrate adjacent to the layer of graphene.

15. The device of claim 1, wherein the at least one conductive trace is at least partially disposed within the encasing material.

16. A device comprising:
    a dielectric substrate;
    a layer of graphene disposed over at least a portion of the dielectric substrate;
    at least one conductive trace disposed on top of the substrate adjacent to the layer of graphene;
    one or more liquid metal contacts, wherein each liquid metal contact electrically connects the layer of graphene and a separate one of each of the at least one conductive trace, the liquid metal contacts comprising a gallium-based alloy in stable liquid form over a temperature range of between about −19° C. and about 1300° C., the liquid metal contacts each being in contact with a portion of the layer of graphene and an adjoining portion of a respective one of the at least one conductive trace; and
    an encasing material disposed over and enclosing the liquid metal contacts, wherein the encasing material comprises a synthetic organic-based material.

17. The device of claim 16, wherein the substrate comprises a flexible material.

18. The device of claim 16, wherein the gallium-based alloy comprises two or more of gallium, indium, and tin.

19. A device comprising:
    a flexible dielectric substrate;
    a layer of graphene disposed over at least a portion of the dielectric substrate;
    at least one conductive trace disposed on top of the substrate adjacent to the layer of graphene;
    one or more liquid metal contacts, wherein each liquid metal contact electrically connects the layer of graphene and a separate one of each of the at least one conductive trace, the liquid metal contacts comprising a gallium-based alloy in stable liquid form over a temperature range of between about −19° C. and about 1300° C. and comprising two or more of gallium, indium, and tin, the liquid metal contacts each being in contact with a portion of the layer of graphene and an adjoining portion of a respective one of the at least one conductive trace; and
    a synthetic organic-based encasing material disposed over and enclosing the liquid metal contacts, wherein the at least one conductive path is at least partially disposed within the encasing material.

20. The device of claim 19, wherein the layer of graphene comprises one of monolayer graphene, multilayer graphene, graphene microstructures, and graphene nanostructures.

* * * * *